(12) United States Patent
Williamson et al.

(10) Patent No.: US 12,347,800 B2
(45) Date of Patent: Jul. 1, 2025

(54) METHOD OF FABRICATING A CONDUCTIVE LAYER ON AN IC USING NON-LITHOGRAPHIC FABRICATION TECHNIQUES

(71) Applicant: PRAGMATIC SEMICONDUCTOR LIMITED, Cambridge (GB)

(72) Inventors: Ken Williamson, Sedgefield (GB); Richard Price, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 588 days.

(21) Appl. No.: 17/611,614

(22) PCT Filed: May 19, 2020

(86) PCT No.: PCT/GB2020/051222
§ 371 (c)(1),
(2) Date: Nov. 16, 2021

(87) PCT Pub. No.: WO2020/234583
PCT Pub. Date: Nov. 26, 2020

(65) Prior Publication Data
US 2022/0230979 A1 Jul. 21, 2022

(30) Foreign Application Priority Data
May 21, 2019 (GB) ..................................... 1907158

(51) Int. Cl.
*H01L 23/00* (2006.01)
*H01L 23/367* (2006.01)
(Continued)

(52) U.S. Cl.
CPC ............ *H01L 24/19* (2013.01); *H01L 23/367* (2013.01); *H01L 23/4985* (2013.01);
(Continued)

(58) Field of Classification Search
CPC ............... H01L 23/367; H01L 23/4985; H01L 23/5225; H01L 23/552; H01L 23/562;
(Continued)

(56) References Cited

U.S. PATENT DOCUMENTS 5,120,665 A 6/1992 Tsukagoshi et al.
5,804,882 A 9/1998 Tsukagoshi et al.
(Continued)

FOREIGN PATENT DOCUMENTS

DE 3924439 A 4/1991
EP 1093160 A2 4/2001
(Continued)

OTHER PUBLICATIONS

U.S. Appl. No. 17/611,604, filed Nov. 16, 2021, Cobb et al.
(Continued)

*Primary Examiner* — Thanh T Nguyen
(74) *Attorney, Agent, or Firm* — Jason H. Vick; Amped IP LLC

(57) ABSTRACT

A method for fabricating a thin-film integrated circuit, IC, including a plurality of electronic components, the method comprising: forming, using a first fabrication technique, the plurality of electronic components, and forming, using a second fabrication technique, a conductive layer on the plurality of electronic components to form a redistribution layer, RDL, wherein the first fabrication technique includes photolithographic patterning, and the first fabrication technique is different to the second fabrication technique.

14 Claims, 5 Drawing Sheets

(51) Int. Cl.
*H01L 23/498* (2006.01)
*H01L 23/522* (2006.01)
*H05K 1/18* (2006.01)

(52) U.S. Cl.
CPC ........ *H01L 23/5225* (2013.01); *H01L 23/562* (2013.01); *H01L 24/05* (2013.01); *H01L 24/16* (2013.01); *H01L 24/20* (2013.01); *H01L 24/32* (2013.01); *H01L 24/83* (2013.01); *H05K 1/181* (2013.01); *H01L 24/81* (2013.01); *H01L 24/82* (2013.01); *H01L 2224/03318* (2013.01); *H01L 2224/04105* (2013.01); *H01L 2224/16265* (2013.01); *H01L 2224/16268* (2013.01); *H01L 2224/2919* (2013.01); *H01L 2224/32268* (2013.01); *H01L 2224/81203* (2013.01); *H01L 2224/81898* (2013.01); *H01L 2224/83203* (2013.01); *H01L 2224/83851* (2013.01); *H01L 2924/30105* (2013.01); *H01L 2924/3025* (2013.01); *H01L 2924/3511* (2013.01); *H01L 2924/3512* (2013.01)

(58) Field of Classification Search
CPC ....... H01L 23/645; H01L 24/02; H01L 24/05; H01L 24/16; H01L 24/19; H01L 24/20; H01L 24/32; H01L 24/83; H01L 2223/6677; H01L 2224/02311; H01L 2224/02317; H01L 2224/02372; H01L 2224/03318; H01L 2224/04105; H01L 2224/05548; H01L 2224/16145; H01L 2224/16238; H01L 2224/16265; H01L 2224/16268; H01L 2224/2919; H01L 2224/32145; H01L 2224/32225; H01L 2224/32265; H01L 2224/32268; H01L 2224/81191; H01L 2224/81192; H01L 2224/81193; H01L 2224/81203; H01L 2224/81898; H01L 2224/81903; H01L 2224/83101; H01L 2224/83203; H01L 2224/83851; H01L 24/13; H01L 24/81; H01L 24/82; H01L 2924/19042; H01L 2924/19104; H01L 2924/30105; H01L 2924/3025; H01L 2924/3511; H01L 2924/3512; H05K 1/181; H05K 1/188
See application file for complete search history.

(56) References Cited

U.S. PATENT DOCUMENTS

| | | | |
|---|---|---|---|
| 5,953,589 | A | 9/1999 | Shim et al. |
| 6,069,026 | A * | 5/2000 | Terrill ................ H01L 25/50 |
| | | | 257/E21.705 |
| 6,346,750 | B1 | 2/2002 | Jiang et al. |
| 8,083,150 | B2 | 12/2011 | Sakurai et al. |
| 8,766,284 | B1 | 7/2014 | Dutta |
| 10,134,685 | B1 | 11/2018 | Chen et al. |
| 2002/0105078 | A1 | 8/2002 | Lee et al. |
| 2002/0196614 | A1 | 12/2002 | DiBene, II et al. |
| 2003/0057550 | A1 | 3/2003 | Zhao et al. |
| 2008/0067656 | A1 | 3/2008 | Leung et al. |
| 2008/0150093 | A1 | 6/2008 | Jang et al. |
| 2010/0214759 | A1 | 8/2010 | Beddingfield et al. |
| 2010/0244222 | A1 | 9/2010 | Chi et al. |
| 2010/0290191 | A1* | 11/2010 | Lin ...................... H01L 24/82 |
| | | | 361/764 |
| 2011/0090658 | A1 | 4/2011 | Adams et al. |
| 2011/0140258 | A1 | 6/2011 | Do et al. |
| 2011/0147901 | A1 | 6/2011 | Huang et al. |
| 2011/0227209 | A1 | 9/2011 | Yoon et al. |
| 2012/0139091 | A1 | 6/2012 | Wakabayashi |
| 2014/0003011 | A1 | 1/2014 | Kato et al. |
| 2014/0021264 | A1 | 1/2014 | Pueschner et al. |
| 2014/0361427 | A1 | 12/2014 | Kim |
| 2014/0361428 | A1 | 12/2014 | Park |
| 2015/0014862 | A1 | 1/2015 | Kwon et al. |
| 2015/0077949 | A1 | 3/2015 | Baek et al. |
| 2015/0091149 | A1 | 4/2015 | Jang et al. |
| 2015/0278675 | A1 | 10/2015 | Finn et al. |
| 2016/0056127 | A1 | 2/2016 | Lee |
| 2016/0254761 | A1 | 9/2016 | Furukawa et al. |
| 2017/0025593 | A1* | 1/2017 | Bower .................. H10K 59/18 |
| 2017/0194263 | A1 | 7/2017 | Kato |
| 2017/0278830 | A1 | 9/2017 | Kim |
| 2018/0006008 | A1 | 1/2018 | Lin et al. |
| 2018/0053732 | A1 | 2/2018 | Baek et al. |
| 2018/0166405 | A1 | 6/2018 | Chiang et al. |
| 2018/0233457 | A1 | 8/2018 | Chen et al. |
| 2018/0247905 | A1 | 8/2018 | Yu et al. |
| 2018/0261557 | A1 | 9/2018 | Yu et al. |
| 2019/0006289 | A1 | 1/2019 | Hunag et al. |
| 2019/0123004 | A1 | 4/2019 | Chang et al. |
| 2020/0006310 | A1 | 1/2020 | Hu et al. |
| 2020/0013735 | A1 | 1/2020 | Liu et al. |
| 2020/0035625 | A1 | 1/2020 | Wang et al. |
| 2020/0051882 | A1 | 2/2020 | Watanabe et al. |
| 2020/0176376 | A1 | 6/2020 | Ndip et al. |
| 2020/0294980 | A1 | 9/2020 | Otsubo et al. |
| 2020/0312821 | A1 | 10/2020 | Yan et al. |
| 2020/0321288 | A1 | 10/2020 | Huang et al. |
| 2021/0013585 | A1 | 1/2021 | Ho et al. |
| 2021/0020559 | A1 | 1/2021 | Hung et al. |
| 2021/0098391 | A1 | 4/2021 | Wu et al. |
| 2021/0242117 | A1 | 8/2021 | Hung et al. |
| 2022/0181267 | A1 | 6/2022 | Kung et al. |
| 2022/0320020 | A1 | 10/2022 | Hsu et al. |

FOREIGN PATENT DOCUMENTS

| | | |
|---|---|---|
| GB | 2581149 A | 8/2020 |
| KR | 10-2015-0001125 A | 1/2015 |
| WO | WO 2007/061216 A1 | 5/2007 |

OTHER PUBLICATIONS

U.S. Appl. No. 17/611,611, filed Nov. 16, 2021, Cobb et al.
Hassan, Mahadi-Ul et al. "Assembly and Embedding of Ultra-Thin Chips in Polymers" XP032547032; EMPC 2013, Grenoble, France; Sep. 9, 2013.
Hollman, Richard et al. "Ultra Fine RDL Structure Fabrication Using Alternative Patterning and Botom-Up Plating Processes" XP033383278; 2018 IEEE 68th Electronic Components and Technology Conference; May 19, 2018.
Mashayekhi, Mohammad et al. "Chip-by-Chip Configurable Interconnection Using Digital Printing Techniques" XP020314891; Journal of Micromechanics and Microengineering; vol. 27, No. 4; Mar. 6, 2017.
Invitation to Pay Additional Fees and, Where Applicable, Protest Fee for International Application No. PCT/GB2020/051219, mailed Aug. 21, 2020.
International Search Report for International Application No. PCT/GB2020/051219, mailed Oct. 13, 2020.
Written Opinion for International Application No. PCT/GB2020/051219, mailed Oct. 13, 2020.
Search Report for Great Britain Application No. 1907158.8, mailed Oct. 24, 2019.
Invitation to Pay Additional Fees and, Where Applicable, Protest Fee for International Application No. PCT/GB2020/051221, mailed Aug. 24, 2020.
International Search Report for International Application No. PCT/GB2020/051221, mailed Oct. 22, 2020.
Written Opinion for International Application No. PCT/GB2020/051221, mailed Oct. 22, 2020.
Invitation to Pay Additional Fees and, Where Applicable, Protest Fee for International Application No. PCT/GB2020/051222, mailed Aug. 27, 2020.

(56) References Cited

OTHER PUBLICATIONS

International Search Report for International Application No. PCT/GB2020/051222, mailed Oct. 19, 2020.
Written Opinion for International Application No. PCT/GB2020/051222, mailed Oct. 19, 2020.
Examination Report Under Section 18(3) for Great Britain Application No. 1907158.8, mailed Aug. 29, 2023.
Gupta, Shoubhik et al. "Ultra-Thin Chips for High-Performance Flexible Electronics" Nature Partner Journals; Mar. 14, 2018.
Johnson Electric "Parlex Options for Shielding Flexible Printed Circuits and Shielded Flexible Flat Cable" Available at https://www.johnsonelectric.com/en/resources-for-engineers/flat-flexible-cables/flat-flexible-cables-design-considerations/flat-flexible-cables-design-considerations-parlex-options-for-shielding-flexible-printed-circuits-and-shielded-flexible-flat-cable; Date Unknown.
Kamikoriyama, Yoichi et al. "Ambient Aqueous-Phase Synthesis of Copper Nanoparticles and Nanopastes with Low-Temperature Sintering and Ultra-High Bonding Abilities" Scientific Reports; Jan. 29, 2019.
Sekitani, Tsuyoshi et al. "Human-Friendly Organic Integrated Circuits" Materials Today; vol. 14, No. 9; Sep. 2011.
International Preliminary Report on Patentability for International Application No. PCT/GB2020/051219, mailed Dec. 2, 2021.
International Preliminary Report on Patentability for International Application No. PCT/GB2020/051221, mailed Dec. 2, 2021.
International Preliminary Report on Patentability for International Application No. PCT/GB2020/051222, mailed Dec. 2, 2021.
Office Action for U.S. Appl. No. 17/611,604, mailed Mar. 7, 2024.
Examination Report Under Section 18(3) for Great Britain Application No. 1907158.8, mailed Nov. 21, 2023.
Examiner's Report of Telephone Conversation for Great Britain Application No. 1907158.8, mailed Dec. 14, 2023.
Intention to Grant Under Section 18(4) for Great Britain Application No. 1907158.8, mailed Jan. 10, 2024.
Office Action for U.S. Appl. No. 17/611,611, mailed Jan. 19, 2024.
Notice of Allowance for U.S. Appl. No. 17/611,611, mailed Oct. 28, 2024.
Office Action for U.S. Appl. No. 17/611,604, mailed Jul. 22, 2024.
Office Action for U.S. Appl. No. 17/611,604, mailed Sep. 25, 2024.
Office Action for U.S. Appl. No. 17/611,611, mailed Jul. 25, 2024.
Notice of Allowance for U.S. Appl. No. 17/611,604, mailed Feb. 12, 2025.

* cited by examiner

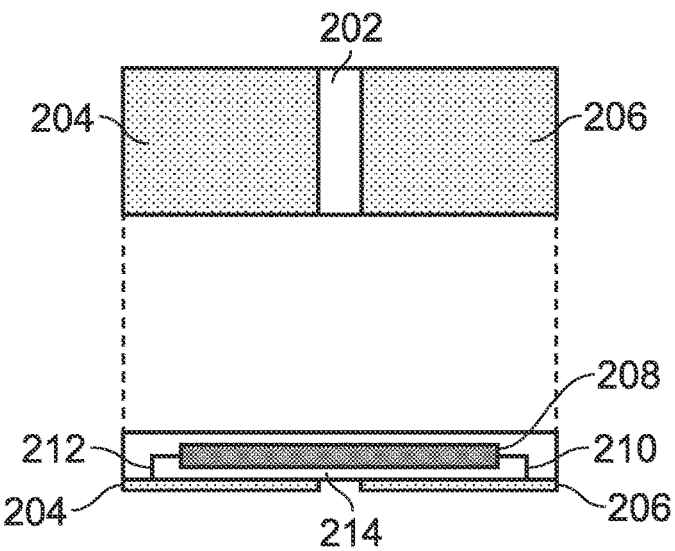
FIG. 2A
FIG. 2B
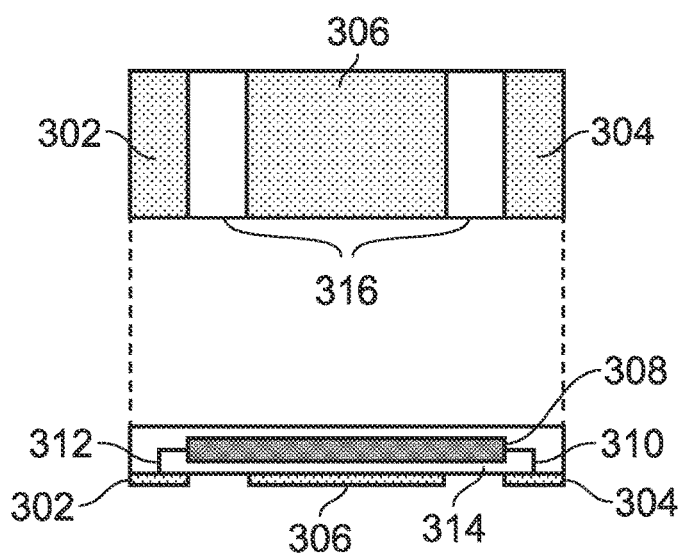
FIG. 3A
FIG. 3B
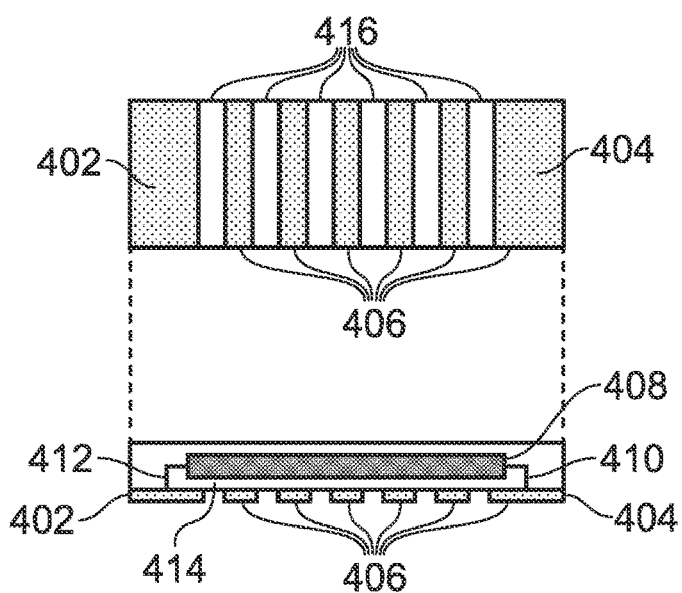
FIG. 4A
FIG. 4B

METHOD OF FABRICATING A CONDUCTIVE LAYER ON AN IC USING NON-LITHOGRAPHIC FABRICATION TECHNIQUES

CROSS-REFERENCE TO RELATED APPLICATIONS

This application is a national stage application under 35 U.S.C. 371 of PCT Application No. PCT/GB2020/051222 having an international filing date of 19 May 2020, which designated the United States, which PCT application claimed the benefit of Great Britain Application No. 1907158.8, filed 21 May 2019, each of which are incorporated herein by reference in their entirety.

FIELD OF THE DISCLOSURE

The present disclosure relates to methods for non-lithographic patterning, and in particular, the use of non-lithographic patterning in the manufacture of thin-film integrated circuits.

BACKGROUND OF THE DISCLOSURE

Thin-film or flexible Integrated circuits (ICs) are often used in scenarios where large volumes of ICs are required at a relatively low cost. For example, flexible ICs may be used in large numbers for asset tracking or environmental monitoring. Due to the large volume of ICs, even relatively small reductions in the complexity and/or cost of flexible ICs themselves and/or their manufacturing process can have significant impacts on total production costs.

Consequently, there is need for approaches for reducing the complexity and/or cost of flexible ICs and their manufacturing process.

BRIEF SUMMARY OF THE DISCLOSURE

It is an aim of certain examples of the present disclosure to provide a reduced complexity and/or duration manufacturing process for flexible ICs.

According to a first aspect of the present disclosure, there is provided a method for fabricating a thin-film integrated circuit, IC, including a plurality of electronic components, the method comprising: forming, using a first fabrication technique, the plurality of electronic components, and forming, using a second fabrication technique, a conductive layer on the plurality of electronic components to form a redistribution layer, RDL, wherein the first fabrication technique includes photolithographic patterning, and the first fabrication technique is different to the second fabrication technique.

In one example of the present disclosure, the first fabrication technique has a higher resolution (i.e. smaller minimum feature size) than the second fabrication technique.

In another example of the present disclosure, a deposition technique of the first fabrication technique is different to a deposition technique of the second fabrication technique.

In another example of the present disclosure, the photolithographic patterning of the first fabrication technique has a higher resolution (i.e. smaller minimum feature size) than a patterning technique of the second fabrication technique.

In another example of the present disclosure, the RDL includes at least one region of the conductive layer electrically connected to at least one of the plurality of electronic components of the thin-film IC, and at least one region of the conductive layer electrically isolated from the plurality of electronic components of the thin-film IC.

In another example of the present disclosure, the method further includes applying a passivation layer between the plurality of electronic components and the conductive layer.

In another example of the present disclosure, the at least one electrically isolated region of the conductive layer is configured to provide mechanical support to the thin-film IC.

In another example of the present disclosure, the at least one electrically isolated region of the conductive layer is configured to shield one or more of the plurality of electronic components of the thin-film IC from damage.

In another example of the present disclosure, the second fabrication technique is a printing-based fabrication technique.

In another example of the present disclosure, the second fabrication technique includes the printing of a conductive ink to form the conductive layer.

In another example of the present disclosure, the second fabrication technique includes laser ablation In another example of the present disclosure, the conductive layer is formed to include one or more protrusions for forming an electrical connection with an external circuit when the thin-film IC is bonded to the external circuit.

In another example of the present disclosure, forming the electrical connection with the external circuit when the thin-film IC is bonded to the external circuit includes at least one of: penetrating a contact element of the external circuit by the one or more protrusions, penetrating an electronic component of the external circuit by the one or more protrusions, and penetrating through a passivation of the external circuit by the one or more protrusions to form an electrical connection with an electronic component of the external circuit.

In another example of the present disclosure, the conductive layer includes at least one region electrically connected to an electronic component from the plurality of electronic components of the thin-film IC, and wherein the at least one region is configured to be penetrated by one or more protrusions of an external circuit to form an electrical connection between the electronic component of the thin-film IC and the external circuit.

In another example of the present disclosure, the electrical connection to the external circuit is for the communication of signals to be transmitted by or received by an antenna of the external circuit.

According to a second aspect of the present disclosure there is provided an thin-film IC fabricated in accordance with any of the above-described aspects and examples of the present disclosure.

BRIEF DESCRIPTION OF THE DRAWINGS

Examples in accordance with the present disclosure are further described hereinafter with reference to the accompanying drawings, in which:

FIGS. 1A, 1B and 10 provide a schematic illustration of an example fabrication process for a redistribution layer (RDL) for a thin-film integrated circuit (IC) in accordance with the present disclosure;

FIGS. 2A and 2B provide a schematic illustration of an example RDL for a thin-film IC in accordance with the present disclosure;

FIGS. 3A and 3B provide a schematic illustration of an example RDL for a thin-film IC in accordance with the present disclosure;

FIGS. 4A and 4B provide a schematic illustration of an example RDL for a thin-film IC in accordance with the present disclosure;

DETAILED DESCRIPTION

Figure 1A:
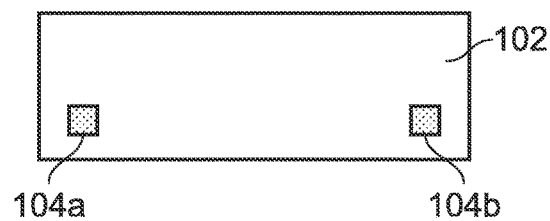

The fabrication of thin-film ICs, such as flexible ICs for instance, commonly involves the deposition of a material onto a flexible substrate or a previously fabricated layer and the subsequent patterning of the material. This process may then be repeated a number of times to form a plurality of layers of patterned materials that form the electronic components of the thin-film IC.

The deposition of the materials may be performed using a number of different approaches, such as physical or chemical deposition, which themselves include many different techniques including evaporation techniques, sputtering techniques, plating techniques, printing-based techniques and chemical vapour deposition for example, where these techniques are often used to deposit a blanket layer of material onto a substrate or previously patterned material/layer.

Following the deposition of a layer of material, selected parts of the material may be removed during a patterning process in order to form the relevant components or constituent parts of components. Patterning techniques that involve the removal of material are termed subtractive techniques, with photolithographic patterning and etching being a commonly used technique due to its high precision and quality, where the accuracy/resolution (i.e. minimum feature size) of photolithographic patterning is usually comparable with the wavelength of the light used to perform the photolithography. Given this, photolithography is commonly used in the manufacture of thin-film ICs. The process of deposition and patterning then may be performed numerous times in order to form the internal components of the thin-film IC. However, in some fabrication techniques, these steps may not be separate, for example, in printing-based techniques a subsequent patterning stage may not be required as the material is selectively deposited in appropriate areas to form the components.

Despite the advantages and widespread use of photolithographic patterning in the fabrication of thin-film ICs, it may have one or more disadvantages, some of which are set out below.

Firstly, photolithographic patterning involves a number of distinct steps that may lead to increased duration and complexity. For example, photolithographic patterning may include one or more of depositing a photoresist on the previously deposited material layer, exposing the photoresist to light through a mask, baking and developing the photoresist, and etching the photoresist to remove the unwanted material. These steps would then be required to be performed for each separate layer.

Secondly, subtractive techniques such as photolithographic patterning produce waste that is required to be removed and appropriately disposed of.

Thirdly, all devices on a substrate are patterned simultaneously according to the fixed design of the photoresist masks for each layer, where the masks are not able to be altered once they have been made, thus preventing easy customisation of devices.

Fourthly, the etching process required for photolithographic patterning may use hot acids, leading to more complex handling and safety requirements.

Lastly, given the high accuracy of photolithography, it may be over-specified for low value and/or low precision components of a thin-film IC.

In addition to photolithographic methods, other approaches to patterning may be used, such as laser ablation for example, which removes portions of the deposited material using an infra-red laser for instance. However, the precision of laser ablation techniques is limited by the laser spot size and thermal effects on the surrounding material, and it is not typically used to pattern features of ICs.

Other examples of subtractive patterning techniques include demetallisation, which is a chemical etching process compatible with high throughput printing lines such as gravure, inkjet-printed etchants and/or resists, and mechanical removal of the metal by milling. However, as for laser ablation, these techniques have a lower accuracy/resolution compared to photolithography.

Consequently, utilising a single type of patterning technique can lead to difficulties in reducing one or more of the complexity, duration and cost of thin-film IC fabrication whilst also maintaining the functionality, reliability and size of the resulting thin-film IC.

Therefore, in accordance with the present disclosure it is proposed to use a combination of different types of patterning techniques when fabricating a thin-film IC in order to take advantage of the benefits of particular patterning techniques whilst, where possible, avoiding or lessening their disadvantages.

During the manufacture of thin-film ICs, once the functional components of the thin-film IC have been formed, for example on a substrate if one is present, and an optional passivation layer applied, a blanket layer of a conductor may be deposited over the upper surface (e.g. a passivated side) of the thin-film IC in order to protect and/or provide connections from the components of the thin-film IC to external structures, such as an application circuit for example, via conducting interconnects on the upper surface of the thin-film IC. Such a layer is commonly referred to as a redistribution layer (RDL) due to its role in the distribution of signals from the conducting interconnects to other locations on the surface of an IC. An RDL usually comprises one or more bond/bonding pads intended to connect to the external structure, where the bond pads are connected to the components of the IC, via the conducting interconnects for example, and may be aligned with contact pads of the external structure.

Figure 1B:
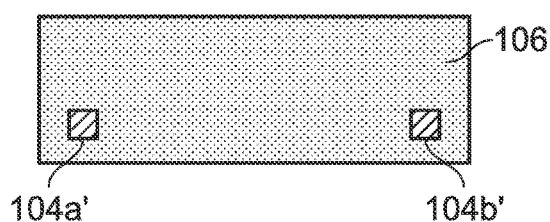
Figure 1C:
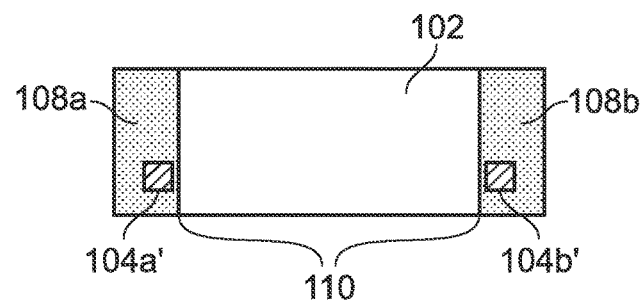

FIGS. 1A to 1C provide a schematic illustration of the steps in the formation of a RDL or other conducting layer during the manufacture of a thin-film IC.

FIG. 1A illustrates a top down view of the upper surface 102 (e.g. passivated side) of a thin-film IC. The upper surface 102 may be formed from the upper surfaces of one or more components of the thin-film IC and/or a passivation/insulating layer that has been deposited on the components of the thin-film IC. The upper surface 102 may comprise one or more electrical interconnects or conductive vias 104a and 104b that connect through to internal components of the thin-film IC through the upper surface and possibly one or more further layers.

In FIG. 1B, a conductive layer 106, such as a metal layer for example, has been deposited over the upper surface of the thin-film IC. The locations of the conductive vias beneath the conductive layer 106 are shown by 104a' and 104b', where the conductive vias electrically connect the conductive layer to one or more internal components of the thin-film IC. The conductive layer 106 may be formed from metals including Al, Ti, Cu, Au; one or more conducting oxides such as ITO, RuOx; or one or more organic films containing carbon. Although the connection between the RDL and components of the thin-film IC has been explained with reference to conductive vias, other suitable connection methods may also be used.

Following the deposition of the conductive layer 106, at least one portion of the conductive layer is removed to form the final structure/arrangement of conductive material, which in the case of an RDL may correspond to the contact pads of the external structure to which the thin-film IC is to be connected/bonded.

FIG. 1C illustrates the thin-film IC once a portion 110 of the conductive layer 106 has been removed. In this case, an RDL has been formed that includes two independent bond pads 108a and 108b, that are respectively electronically connected to the conductive vias 104a and 104b. The bond pads 108a and 108b may then be used to connect the thin-film IC to an external structure such as an external application circuit. Although the size of the portion 110 of the conductive layer removed is relatively large, in some examples it may only be necessary to remove an amount of the conductor layer sufficient to electrically isolate or introduce a discontinuity between the bond pads 108a and 108b.

Compared to the tolerances that may be required to fabricate the internal components of a thin-film IC, the tolerances required for forming an RDL are likely to be lower since the dimensions of the bond pads are likely to be larger than the internal components. Consequently, the use of high precision techniques such as photolithography for forming both the internal components of a thin-film IC and the bond pads of an RDL may be considered to be an over-specification with respect the RDL bond pads.

Therefore, in accordance with the present disclosure, a plurality of different fabrication/patterning techniques are used in the fabrication of a thin-film IC such that lower precision techniques can be used for features of the thin-film IC that are not subject to the same precision/tolerances as at least some of the internal components of the thin-film IC. By utilising a combination of the different fabrication techniques, techniques suitable for the required precision of the structure being fabricated can be selected, therefore allowing lower precision techniques to be used for lower precision aspects of the thin-film IC. In turn, this may allow one of or more of the complexity, duration and cost of manufacturing thin-film ICs to be reduced. Although differing patterning techniques are predominantly referred to in the following description, more generally different fabrication techniques may be used, where fabrication techniques may differ based on their deposition and/or their patterning techniques.

With respect to the fabrication of a thin-film IC that includes a RDL, photolithography may be used for the patterning of the internal components but a lower precision technique such as laser ablation or etching used for removing parts of the RDL to form the bond pads. Alternative, lower precision techniques such as demetallisation, inkjet-printed etchants and/or resists, and mechanical removal of the metal by milling may also be used to form the bond pads of the RDL. In yet another alternative, selective deposition techniques, for example the printing of a conductive ink (e.g. a metallic ink), may be used to form the RDL and its features, such that separate deposition and patterning steps may not be required.

The deposition and patterning of the conductive layer (i.e. RDL) may occur at any suitable time during fabrication of the thin-film IC. For example, it may be convenient to deposit and pattern the conductive layer after a programming step has been applied to laser-programmable features of the thin-film IC, such as a laser-programmable read-only memory (LPROM) or One Time Programmable (OTP) logic for example. Alternatively, the conductive material could be first removed from the region above the programmable features and from the vicinity of the bond pads, then the programmable features programmed.

Given that the removal of regions of the conductive layer occur after the formation of the internal components of the thin-film IC, it is important that the patterning technique does not cause significant damage to functional layers beneath the area of conductive material being removed. This may be achieved by careful 3-dimensional IC design, by suitably controlling the patterning technique and/or by the placement of structures in a layer between the conductive layer and the functional layer(s) below, for example metal features or other features of a suitable material may be placed in a layer above transistors or other functional circuit components to shield them from damage from the patterning technique. This may include the use of an absorptive layer between the conductive layer and the functional layers below. Such an absorptive layer may absorb sufficient radiation from a laser used to ablate the conductive layer, and that passes through the conductive layer, to protect the functional circuit components beneath it. One example may be a polymer layer containing water molecules that absorb laser radiation, for example infra-red (IR) laser radiation, that ablates and is partially transmitted by the conductive layer. In some approaches, functional components may be placed in regions laterally displaced from regions where the conductive layer is to be removed.

In examples where laser ablation is used to pattern the conductive layer, the laser power may be suitably controlled by appropriately setting one or more of the pulse length, pulse rate and pulse energy for example. Alternatively or additionally, structures may also be placed within the thin-film IC to shield internal components from the laser, as described above.

FIGS. 2A and 2B, 3A and 3B, and 4A and 4B (not to scale) illustrate alternative RDL structures that may be formed on a thin-film IC using patterning and/or deposition techniques that are different to those used to form at least some of the internal functional components of the thin-film IC. However, the conductive layer and its structures are not limited to being part of an RDL layer, nor are they required to be exclusively formed using different deposition and/or patterning techniques to the internal functional components of the thin-film IC, and their advantages may lie in the specific structure/arrangement of the conductive regions resulting from the patterning of the conductive layer rather than the specific fabrication technique used. Whilst, for clarity, simple RDL structures are shown in FIGS. 2A and 2B, 3A and 3B, and 4A and 4B, it will be appreciated that a wide range of structures are possible. For example, RDL structures may be formed that do not extend to the edges of the thin-film IC, are not limited to perpendicular or rectangular forms, or do not have straight edges. For some deposition or patterning techniques, for example laser ablation, it may take more time to form more complex structures.

FIG. 2A illustrates a top down view of an upper side of a thin-film IC including an RDL where only a relatively small region 202 of the conductive material has been removed, for example, an area sufficient to electrically isolate the areas 204 and 206. In addition to or as an alternative to providing two isolated areas that may act as bond pads, removing a reduced size area of the conductive layer compared to FIG. 10 may reduce the likelihood that underlying components of the thin-film IC may be damaged by the patterning technique, and/or the remaining portions of the conductive layer may act to protect the thin-film IC and/or its internal components from damage from at least one of mechanical stress and external objects such as protrusion of structures the thin-film IC may be connected to or mounted on. In some examples, the size of one or more of the bond pads 204, 206 may also be increased in order to protect or support particular areas or components of the thin-film IC.

FIG. 2B provides a schematic illustration of a cross-sectional view of the thin-film IC of FIG. 2A, where the at least one electronic component or internal component 208 of the thin-film IC are electrically connected to the bond pads 204, 206 by the electrical connections (e.g. conducting vias) 210 and 212. The thin-film IC may also include a flexible body 214 or insulating material that covers or encases the electronic components 208. Although the thickness of the conductive layer and thus the bond pads are shown to be comparable to the thin-film IC and/or electronic components, this is for illustrative purposes only and the thickness of the conductive layer may be any appropriate thickness, depending on the requirements placed upon the conductive layer.

FIG. 3A illustrates a top down view of an upper side of a thin-film IC for an example structure of the conductive layer/RDL where it may be advantageous to have an increased number of bond pads, or where additional isolated regions of the conductive layer may be used for other purposes. For example, the regions 302, 304, and 306 formed by the removal of the areas 316 of the conductive layer may be bond pads 302, 304 but also include an additional electrically isolated area 306 that may or may not be electrically connected to the internal components of the thin-film IC. In some situations, the region 306 may act as a shield to protect upper layers of the thin-film IC, e.g. from penetration by particles in anisotropic conductive adhesive or other protruding structures, or may instead provide physical support, stand-off and/or planarisation for the thin-film IC between the bond pads. For example, potential bowing or deformation of the thin-film IC between the bond pads may be reduced by the region 306 due to the more rigid nature of the conductive material, further reducing the risk of damage during bonding or subsequent use with an external structure or any other external surface. Additionally or alternatively, region 306 or equivalent regions may provide thermal or electronic functions such as heat spreading/sinking and/or an electrical reference plane. In particular, the region 306 may be thermally coupled to internal components of the thin-film IC through heat-conducting structures to allow heat extraction from the vicinity of particular components.

The thickness of the conductive layer may be chosen so as to provide sufficient structural protection against anticipated damage. Further, the thickness may be configured to project from the surface of the thin-film IC, so as to provide a 'stand-off' distance between the surface of the thin-film IC and an external structure as such as an application circuit.

FIG. 3B illustrates a cross-sectional view of the thin-film IC of FIG. 3A, where the internal components 308 of the thin-film IC are electrically connected to the bond pads 302, 304 by the electrical connections (e.g. conducting vias) 310 and 312. The thin-film IC may also include a flexible body 314 or insulating material that covers or encases the electronic components 308.

FIG. 4A illustrates a top down view of an upper surface of a thin-film IC for another example structure/arrangement of a conductive layer/RDL. As in FIGS. 3A and 3B, the two end portions of the conductive material 402 and 404 may act as bond pads and therefore be electrically connected to the internal components of the thin-film IC. However, the other regions 406 of the conductive layer formed by the removal of regions 416 of the conductive layer may be electrically isolated from one another, the bond pads, and the internal components of the thin-film IC. Furthermore, the arrangement of the regions 406 may depend on the nature of any surface features of the external structure to which the thin-film IC may be connected/bonded. By virtue of their isolation, regions 406 may act to protect the thin-film IC and/or provide mechanical support to the thin-film IC without shorting conductors in an application circuit that the thin-film IC may be connected to. For example, in an example where the thin-film IC is to be connected to an external structure such as an inductor, an antenna or antennas, each of the regions 406 may correspond to a turn of the inductor/antenna or a different inductor antenna, thus providing support to the thin-film IC and/or inductor or antenna without shorting the turns of the inductor/antenna/antennas.

Alternatively, the regions 406 may be positioned in such a way to provide gaps to allow, for example, optical access to selected internal components 408 of the thin-film IC (e.g. laser-programmable features), whilst still providing additional support or other functionality.

FIG. 4B illustrates a cross-sectional view of the thin-film IC of FIG. 4A, where the internal components 408 of the IC are electrically connected to the bond pads 402, 404 by the electrical connections (e.g. conducting vias) 410 and 412. The thin-film IC may also include a flexible body 414 or insulating material that covers or encases the electronic components 408.

In addition to the various functions of the conductive layer/RDL and the regions thereof, other supplementary functions may be provided to the thin-film IC. For example, the conductive layer may be configured/designed to minimise parasitic interactions with the thin-film IC by minimising overlap capacitance and/or increasing the thickness and/or reducing the relative permittivity of an upper insulating layer (i.e. dielectric, passivation layer) separating the functional components of the thin-film IC and bond pads and other regions in the conductive layer. Optionally or additionally, the conductive layer may be configured to provide optical shielding of at least part or all of the underlying thin-film IC (e.g. memory cells) to prevent or inhibit discovery of the circuit details (e.g. memory cell content). Furthermore, the conductive layer may be configured to provide shielding to electro-magnetic interference (EMI) or radiation (e.g. β-rays). For example, the conductive layer may comprise a predetermined patterning (e.g. patterned contact layout) adapted to minimise EMI, and/or, the conductive layer may be made of, or covered with, a material suitable to minimise EMI and/or the transmission of radiation (e.g. β-rays).

Other variations on the arrangement of the isolated regions and/or regions where the conductive material has been removed in order to provide additional functionality are also possible. For example, the arrangement of the regions 406 and/or regions where the conductive material has been removed 414 may be used to encode information for identification and/or tracking of the thin-film IC. One such approach may be to pattern the conductive layer to form a barcode or QR code that has encoded therein an IC identity or other information.

As set out above, the various arrangements and structures of the conductive layer may be formed using a same fabrication technique (i.e. same deposition and patterning techniques) as used to form the internal functional components of the thin-film IC but advantageously may also be formed using alternative fabrication techniques (i.e. different deposition and/or patterning techniques) in order to take advantage of the possibility to use lower complexity/precision fabrication techniques for the conductive layer, which may in turn lead to reductions in one or more of complexity, duration and the cost of thin-film IC fabrication. For example, in terms of patterning, photolithography may be used to form the internal functional components of the thin-film IC and laser ablation used to the pattern the conductive layer.

Table 1 below provides a non-exhaustive summary of the commonly used fabrication techniques (i.e. different combinations of deposition and patterning techniques) that may be used in the fabrication of the various conductive layer structures/arrangements explained above. In Table 1, the ticks and crosses indicate the compatibility or incompatibility of the various deposition and patterning techniques respectively.

TABLE 1

| Deposition Technique | Patterning Technique | | | | |
|---|---|---|---|---|---|
| | Photo-lithography & Etching | Printing | Laser Ablation | De-metallisation | Milling |
| Physical Vapour Deposition (PVD) | ✓ | ✗ | ✓ | ✓ | ✓ |
| Seeding/Electroplating | ✓ | ✗ | ✓ | ✓ | ✓ |
| Printing: Conductive ink on conductive layer | ✗ | ✓ | ✗ | ✗ | ✗ |
| Printing: Conductive ink as conductive layer | ✗ | ✓ | ✗ | ✗ | ✗ |
| Printing: conductive adhesive | ✗ | ✓ | ✗ | ✗ | ✗ |

Each of the different combinations of deposition and patterning techniques may have their own advantages and disadvantages, therefore making them more or less suitable for their application to the fabrication of the conductive layer. For example, the printing of conductive ink as the conductive layer may avoid the need for separate deposition and patterning steps and reduce the chance of damage being inflicted on underlying layers of the thin-film IC, but may be of limited precision, thus possibly reducing its suitability for forming more detailed conductive layer structures. Alternatively, some deposition techniques may be better suited for the formation of a thicker conductive layer, and some patterning techniques may be better suited for thin-film ICs where underlying functional components are susceptible to damage from patterning.

The various structures/arrangements of the conductive layer and the various approaches to its fabrication have up to now been considered in the context of their direct advantages e.g. structural benefits and lower cost complexity etc. However, other aspects of the different conductive layer structures, structures of external structure such as application circuits, and fabrication techniques may also be harnessed to provide improved and/or simplified fabrication of thin-film ICs and their attachment to external structures.

As briefly discussed above, thin-film ICs will often be attached/connected/bonded to external structures/circuits such as application circuits, which may include inductors, antennas or other functional elements, where electrical connections may be formed via the bond pads of an RDL with contact pads of the external structure. One approach to achieving such electrical connections is to introduce an anisotropic conductive adhesive (ACA) between the thin-film IC and an application circuit.

ACA consists of an adhesive organic binder with a filling material of conductive particles forming a paste. In general, the adhesive (e.g. ACA) is placed between a thin-film IC and respective contacts of an application circuit. A bonding tool (e.g. thermodes) is then used to press (while applying heat) the conductive particles into respective contacts/bond pads of the thin-film IC and the application circuit forming an electrically conductive interface between the thin-film IC and the application circuit. Since the conductive particles are isolated within the non-conductive adhesive matrix, no lateral conduction takes place. The binder cures thermally to secure the bond between the thin-film and the application circuit.

An advantage of using ACA is that it allows the assembly of thin-film ICs and external structures without the need for an accurate (and hence time-consuming and/or costly) placement of a conductive adhesive onto the small engaging contacts/pads. In fact, the adhesive (i.e. ACA) may cover the whole area of the thin-film IC without the risk of causing a short circuit, because the electrically conductive particles are adapted to only provide a conductive interface between the desired bond pads of the thin-film IC and the contact pads of the application circuit. In addition, when using ACA, there is no need to apply an additional non-conductive adhesive to provide mechanical integrity to the flexible circuit structure/application circuit assembly.

However, when using ACA for bonding, thermodes are required to apply a relatively high pressure so as to squeeze the adhesive layer (e.g. ACA) provided between the thin-film IC and the application circuit until the adhesive layer (e.g. ACA) is a little thinner than the diameter of the conductive particles. While this technique works sufficiently well for rigid silicon chips and other rigid or individual flexible circuits, many thin-film ICs may only have a relatively soft and/or very thin (e.g. <1 μm) protective layer between the embedded circuitry and the adhesive layer (e.g. ACA).

Consequently, there is a danger of the conductive particles (which may be several μm in diameter) to be pressed into the thin-film IC circuit component(s), thus, potentially causing structural damage, short circuits, open circuits and/or other damage to the thin-film IC.

Figure 5A:
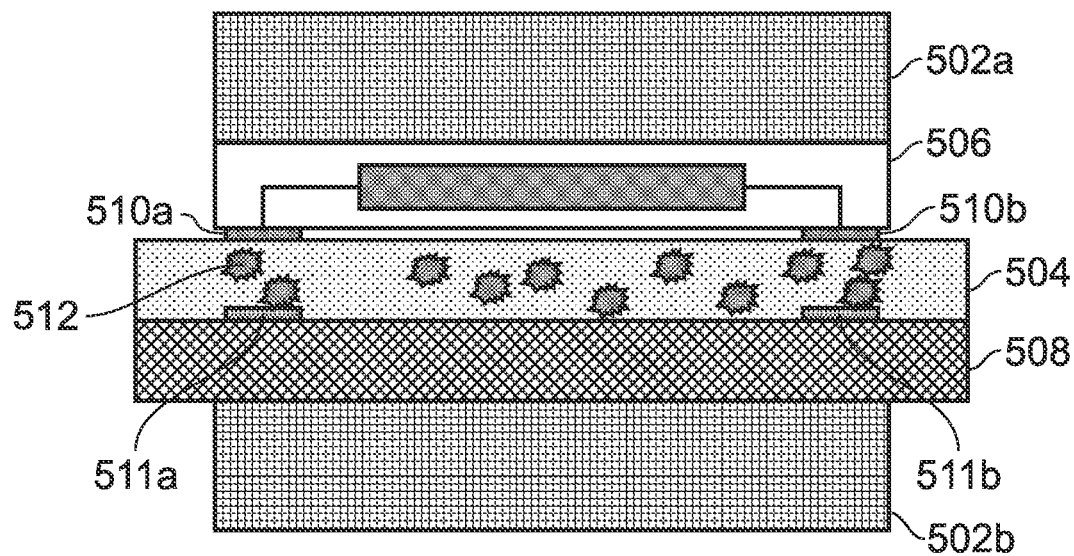
FIGS. 5A and 5B provide a schematic illustration of a bonding process between a thin-film IC and an external application circuit.
Figure 5B:
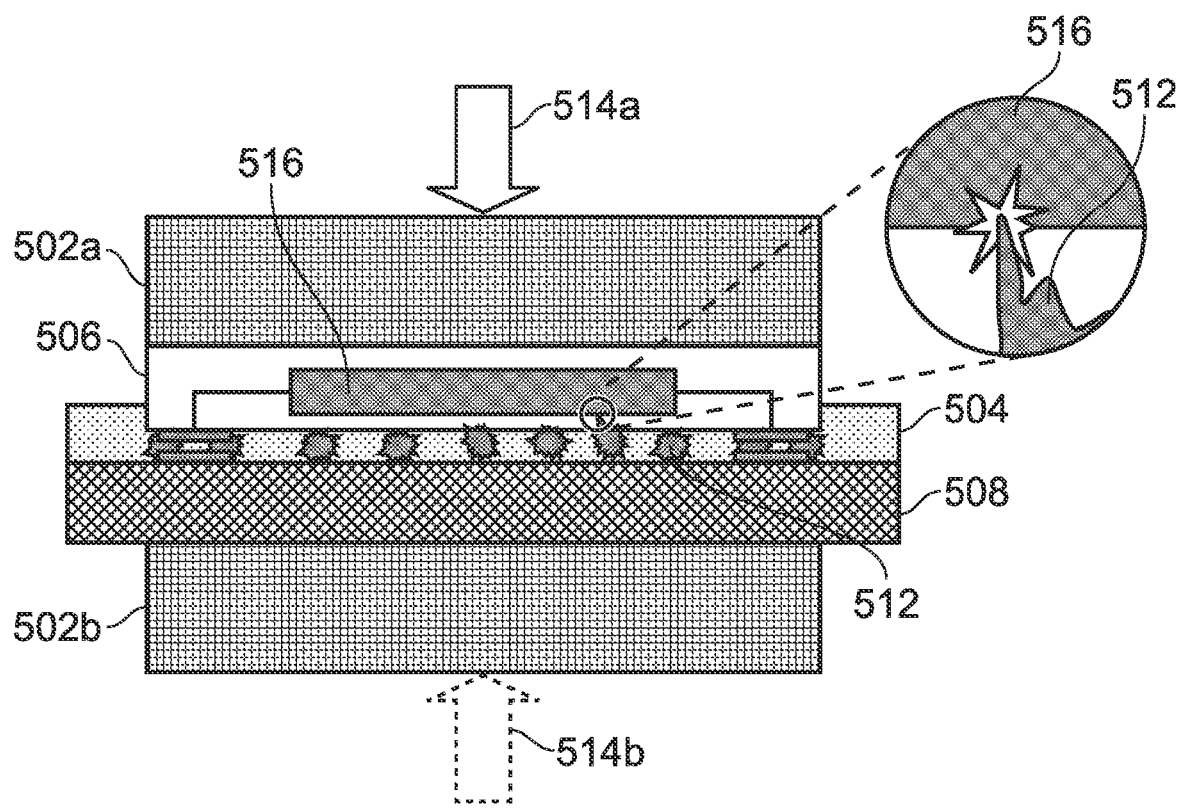

FIGS. 5A and 5B show a simplified illustration of the described bonding technique using thermodes 502a, 502b and an Anisotropic Conductive Adhesive (ACA) layer 504 to operably attach a thin-film IC 506 to an application circuit 508 (e.g. an external structure).

During assembly, the ACA 504 is provided between respective interface surfaces of the thin-film IC 506, which includes circuit contact elements/pads 510a, 510b, and the application circuit 508, which includes circuit contact elements/pads 511a, 511b, wherein an upper thermode 502a and a lower thermode 502b are placed, directly or indirectly, on respective outer surfaces of the thin-film IC 506 and the application circuit 508. Upper and lower thermode 502a, 502b provide a predetermined force by pressing the thin-film IC 506 and the application circuit 508 together while applying a predetermined heat energy. Applied heat and pressure cause the ACA 504 to flow so that conductive particles 512 are trapped between corresponding contact pads/elements 510a, 511a and 510b, 511b thus, forming a localised electrical connection between corresponding contact pads/elements 510a and 511a, and 510b and 51b.

However, as illustrated in FIG. 5B, under pressure (and heat) represented by arrows 514a and 514b, conductive particles 512 may penetrate the outer surface of the thin-film IC 506 potentially damaging the internal components 516 of the thin-film IC. These potentially damaging penetrations may also be protected against using the conductive layer to shield areas of the thin-film IC as previously described above.

Although the presence of sharp particles in ACA may damage a thin-film IC when being bonded to an application circuit, in accordance with the present disclosure, sharp/protruding and thus potentially damaging structures of either the thin-film IC or application circuit/external structure may be used to reduce the use of ACAs for bonding thin-film ICs to application circuits or other external structures and also to increase the robustness of such bonding.

More specifically, sharp protrusions that may result from particular patterning techniques of a conductive layer e.g. RDL or application circuit conductive layer such as a thin film inductor or antenna, or sharp protrusions that have purposely been introduced onto these or other structures may be used to replace the need for the presence of conductive particles in an adhesive and their use in forming electrical connections between the thin-film IC and the application circuit.

Figure 6:
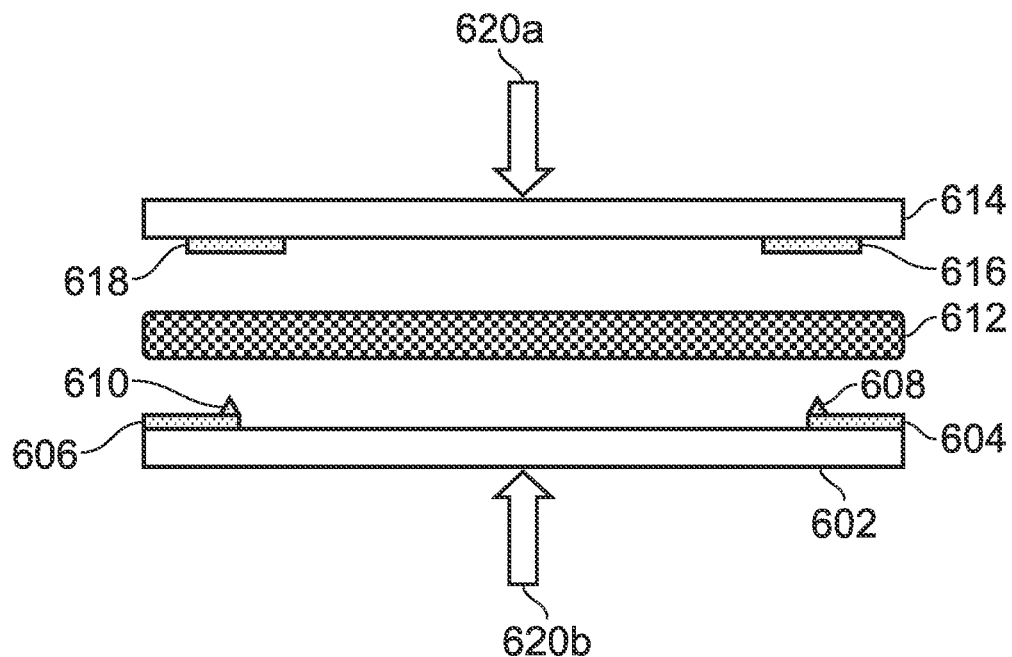
FIG. 6 provides a schematic illustration of a bonding process between a thin-film IC and an external application circuit in accordance with the present disclosure.
Figure 7:
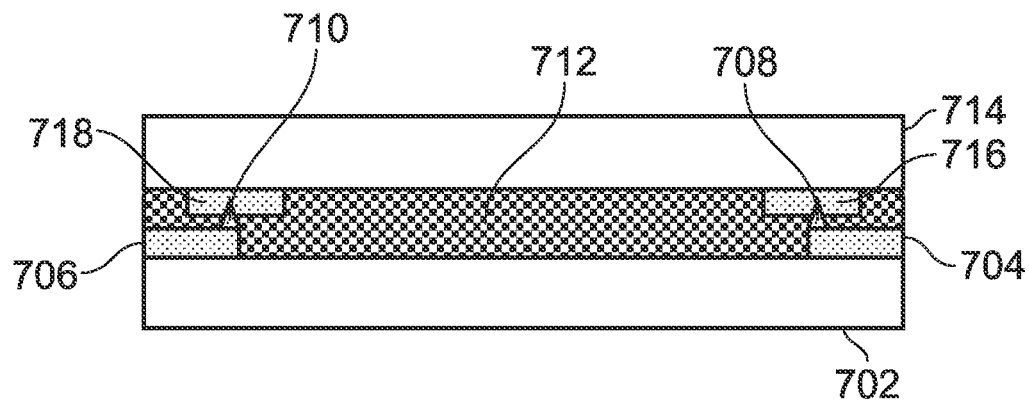
FIG. 7 provide a schematic illustration of a bonding process between a thin-film IC and an external application circuit in accordance with the present disclosure.

FIGS. 6 and 7 illustrate how sharp protrusions of bond pads that form part of an RDL may be used to achieve electrical connections between a thin-film IC and an application circuit.

In FIG. 6, a conductive layer has been deposited on an upper surface of a thin-film IC 602 and then patterning used to form the bond pads 604 and 606. However, either by virtue of characteristics of the patterning or by design of the patterning or deposition, each of the bond pads has a sharp protrusion(s) 608 and 610. Subsequently, to bond the thin-film IC 602 to the application circuit 614, an adhesive paste 612 that does not contain conducting particles is placed between the thin-film IC 602 and the application circuit 614, which includes electrical contacts 616 and 618. The thin-film IC 602 and the application circuit 614 are then forced together under heat and pressure by thermodes as set in FIG. 5B, and as represented by arrows 620a and 620b.

FIG. 7 shows the result of the bonding process of FIG. 6. As a result of the pressure, the thin-film IC 702 and application circuit 714 are bonded and the structures 708 and 710 have penetrated through the adhesive to make contact with the electrical contacts 716 and 718 of the application circuit, thus avoiding the need for conductive particles in the adhesive in order to form the electrical connections between the thin-film IC 702 and the application circuit 714. By virtue of this approach, damage that may be caused by the conductive particles of an ACA may be avoided. In both FIGS. 6 and 7, although the electrical contacts 716 and 718 of the application circuit are illustrated as being raised from the surface of the application circuit this may not necessarily be the case and connections may instead be formed from direct contact with components of the application circuit.

Although FIG. 7 illustrates that the sharp protruding structures 708 and 710 partially penetrate the electrical contacts 716 and 718 of the application circuit, they may merely abut the surface of the electrical contacts or make contact in other ways suitable for forming an electrical connection. Furthermore, although the structures 708 and 710 are illustrated as being part of the RDL of the thin-film IC, the structures may alternatively be part of the application circuit, for example part of electrical contacts 716 and 718 of the application circuit, and make electrical connections with IC bond pads 704 and 706. In another alternative, both the thin-film IC and the application circuit may be formed to include protrusions, with the protrusions of each either overlapping or not overlapping with each other once the thin-film IC and the application circuit are bonded. In yet another alternative, the structures 708 and 710 may be configured to penetrate through an insulating/passivation/protective layer on the surface of the application circuit or thin-film IC and directly contact an internal component or electrical contact of the thin-film IC or application circuit, thus avoiding the need for dedicated electrical vias. In addition to the formation of electrical connections, the protrusions may also enhance the mechanical connection between the IC and the external structure. For example, if the protrusions penetrate either conductive or insulating layers of the opposing structure during bonding, the mechanical strength of the bonding may be increased.

An example implementation where sharp protruding structures resulting from fabrication may be used in the manner described above is in the connection of thin film inductors or antennas to thin-film ICs. More specifically, when fabricating inductors or antennas from materials such as aluminium, sharp edges, sharp protrusions, sharp ridges or burrs may result from such patterning processes as laser etching and other processes such as peeling, and may be used to penetrate an adhesive and/or a protective layer of a thin-film IC in order to make a connection between the thin-film IC and the inductor(s)/antenna(s) suitable for the communication of signals to be transmitted by the antenna and/or received by the antenna, where the antenna may be an RFID, NFC or other wireless short-range communication antenna. For example, the fabrication of the inductor/antenna may be configured to or unavoidably result in sharp edges or protrusions in particular areas that correspond to either bond pads of the thin-film IC or the output components of the thin-film IC if direct penetrative contact through a protective/passivation layer of the thin-film IC is desired. Therefore, usually undesirable characteristics of particular fabrication techniques or components may be used to achieve a more robust and simplified bonding process between a thin-film IC and an application circuit. In a similar example, the conductive layer (RDL) of the thin-film IC may be formed or patterned using a process that causes sharp edges or burrs, where the sharp edges or burrs may be used to penetrate an adhesive layer or a layer of the application circuit in order to make a connection between the thin-film IC and an antenna, thin film inductor or other application circuit.

Figure 8A:
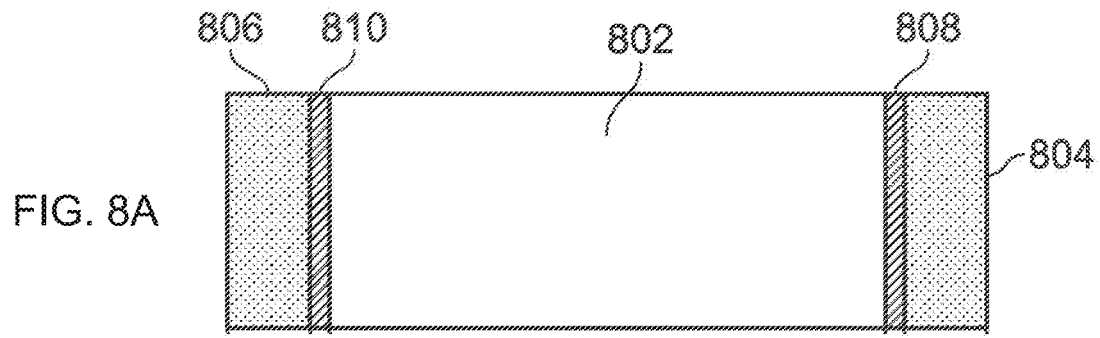
FIGS. 8A and 8B provide a schematic illustration of an example RDL for a thin-film IC in accordance with the present disclosure.
Figure 8B:
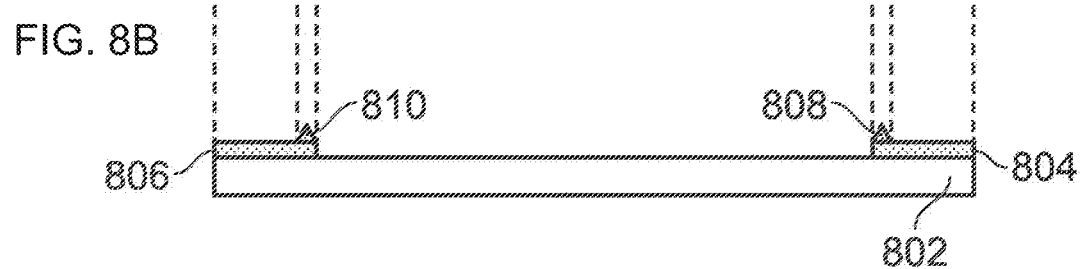

FIGS. 8A and 8B provide an example where a single edge of a region of conductive material, such as a bond pad of an IC or an inductor or antenna winding, includes sharp protrusions intended to form an electrical connection with another entity, such as a thin-film IC or an application circuit for example.

More specifically, the regions of conductive material 804 and 806 each have a single edge 808 and 810 that includes sharp protrusions that may be used to form an electrical connection with another entity, where element 802 may represent a thin-film IC if regions 804 and 806 are bond pads, or a substrate of an inductor or antenna if the regions 804 and 806 are windings of an inductor or antenna.

Figure 9A:
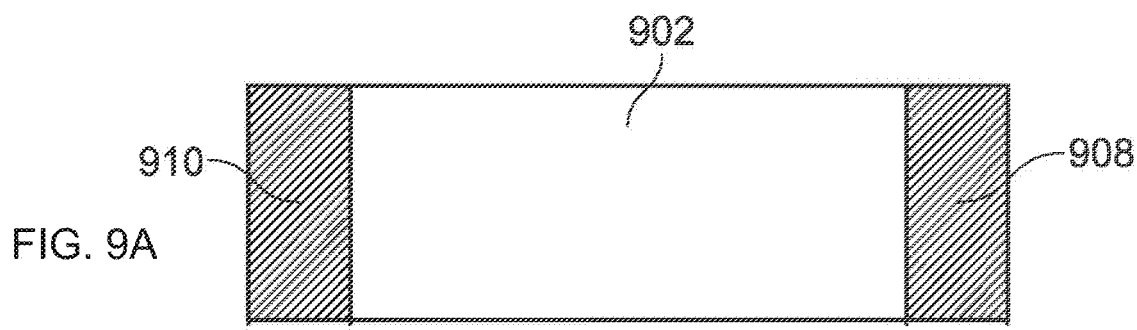
FIGS. 9A and 9B provide a schematic illustration of an example RDL for a thin-film IC in accordance with the present disclosure.
Figure 9B:
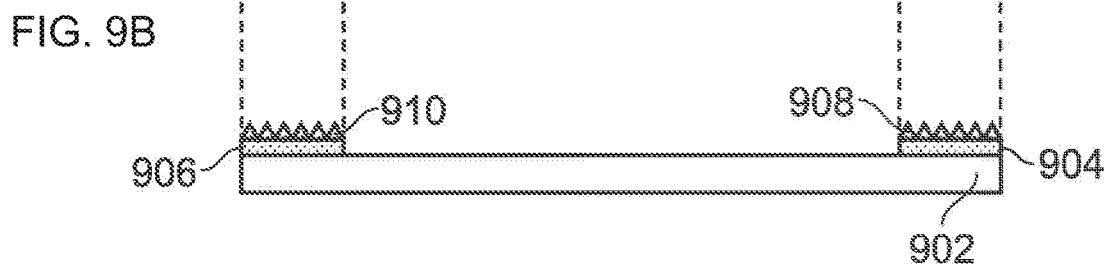

FIGS. 9A and 9B provide an alternative example where the entire surface of the regions of conductive material 904 and 906 includes sharp protrusions 908 and 910, where element 902 may represent a thin-film IC if regions 904 and 906 are bond pads, or a substrate of an inductor or antenna if the regions 904 and 906 are windings of an inductor or antenna. Such surfaces may be prepared with sharp protrusions by, for example, using laser engraving or embossing techniques, or as a result of the particular deposition and/or patterning technique used to form the layer(s) that include the protrusions.

Alternative arrangements of the sharp protrusions/structures are also possible, for example, each of the edges of the regions of conductive material may include the sharp protrusions or only a selection of the edges may include the sharp protrusions. For instance, the sharp protrusions may be formed on the edges that are a result of patterning i.e. where material has been removed via laser etching or ablation for example, or where conductive material has been formed/shaped via peeling.

A further example implementation where sharp protrusion(s) on the contact element(s)/bond pads/electrical contacts resulting from fabrication may be used in the manner described above may arise from the printed deposition and patterning of a conductive ink layer. As the ink dries a 'coffee ring effect' may cause the suspended conductive particles to form a pattern and adopt a roughened outer surface. Such a roughened surface of contact elements that form part of an RDL of the thin-film IC and/or of an external structure may be used to achieve electrical connections between the thin-film IC and an external structure. That is, either the thin-film IC, the external structure or both structures may feature roughened contacts formed in printed conductive ink. Such patterned contacts with rough, raised surfaces may "interlock" via penetration with an opposing contact, and/or may provide a further raised area of conductive contact that is more easily exposed and connected, while adhesive is pushed aside. The local roughness within the contact area may cause the adhesive to be more evenly distributed among the contact points, resulting in a more secure network of conductive connection throughout an adhesive matrix on the local scale within the contact area, even in the absence of "cold weld" metal-metal adhesion.

Throughout the description, the term thin-film IC has been used; however, the terms flexible IC and flexible circuit structure may be used interchangeably and each of the described techniques and conductive layer structures may be applied to each. Furthermore, these terms may be interpreted to include only the internal electronic components, or alternatively also one or more of outer protective layers and outer conductive layers (e.g. RDL).

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention or present disclosure are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method for fabricating a thin-film integrated circuit, IC, including a plurality of electronic components, the method comprising:
    forming, using a first fabrication technique, the plurality of electronic components, and
    forming, using a second fabrication technique, a conductive layer on the plurality of electronic components to form a redistribution layer, RDL,
    wherein the first fabrication technique includes photolithographic patterning, and the first fabrication technique is different to the second fabrication technique, and
    wherein the conductive layer is formed to include one or more protrusions configured to form an electrical connection with an external circuit by penetrating a part of the external circuit when the thin-film IC is bonded to the external circuit.

2. The method of claim 1, wherein one or more of the first fabrication technique has a higher resolution than the second fabrication technique and the first fabrication technique has a smaller minimum feature size than the second fabrication technique.

3. The method of claim 1, wherein a deposition technique of the first fabrication technique is different to a deposition technique of the second fabrication technique.

4. The method of claim 1, wherein one or more of: the photolithographic patterning of the first fabrication technique has a higher resolution than a patterning technique of the second fabrication technique and the photolithographic patterning of the first fabrication technique has a smaller minimum feature size than a patterning technique of the second fabrication technique.

5. The method of claim 1, wherein the RDL includes at least one region of the conductive layer electrically connected to at least one of the plurality of electronic components of the thin-film IC, and at least one region of the conductive layer electrically isolated from the plurality of electronic components of the thin-film IC.

6. The method of claim 5, wherein the at least one electrically isolated region of the conductive layer is configured to provide mechanical support to the thin-film IC.

7. The method of claim 5, wherein the at least one electrically isolated region of the conductive layer is configured to shield one or more of the plurality of electronic components of the thin-film IC from damage.

8. The method of claim 1, wherein the method further includes applying a passivation layer between the plurality of electronic components and the conductive layer.

9. The method of a claim 1, wherein the second fabrication technique is a printing-based fabrication technique.

10. The method of claim 1, wherein the second fabrication technique includes the printing of a conductive ink to form the conductive layer.

11. The method of claim 1, wherein the second fabrication technique includes laser ablation.

12. The method of claim 1, wherein forming the electrical connection with the external circuit when the thin-film IC is bonded to the external circuit includes at least one of: penetrating a contact element of the external circuit by the one or more protrusions, penetrating an electronic component of the external circuit by the one or more protrusions, and penetrating through a passivation of the external circuit by the one or more protrusions to form an electrical connection with an electronic component of the external circuit.

13. The method of claim 1, wherein the conductive layer includes at least one region electrically connected to an electronic component from the plurality of electronic components of the thin-film IC, and wherein the at least one region is configured to be penetrated by one or more protrusions of an external circuit to form an electrical connection between the electronic component of the thin-film IC and the external circuit.

14. The method of claim 1, wherein the electrical connection to the external circuit is for the communication of signals to be transmitted by or received by an antenna of the external circuit.

* * * * *